United States Patent
Binet et al.

(10) Patent No.: US 9,172,339 B2
(45) Date of Patent: Oct. 27, 2015

(54) CASCODE BIAS OF POWER MOS TRANSISTORS

(71) Applicant: ST-Ericsson SA, Plan-les-Ouates (CH)

(72) Inventors: Vincent Binet, Grenoble (FR);
Emmanuel Allier, Grenoble (FR);
Francois Amiard, Grenoble (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/136,469

(22) Filed: Dec. 20, 2013

(65) Prior Publication Data

US 2014/0184328 A1    Jul. 3, 2014

Related U.S. Application Data

(60) Provisional application No. 61/752,002, filed on Jan. 14, 2013.

(30) Foreign Application Priority Data

Dec. 27, 2012  (EP) ..................... 12306692

(51) Int. Cl.
*H03F 3/217* (2006.01)
*H03F 1/02* (2006.01)
*H03F 3/72* (2006.01)

(52) U.S. Cl.
CPC ............ *H03F 3/2171* (2013.01); *H03F 1/0277* (2013.01); *H03F 3/2173* (2013.01); *H03F 3/72* (2013.01); *H03F 2203/7206* (2013.01); *H03F 2203/7236* (2013.01)

(58) Field of Classification Search
USPC ..................... 330/251, 207 A, 296
IPC ........................................ H03F 3/217
See application file for complete search history.

(56) References Cited

U.S. PATENT DOCUMENTS

| | | | |
|---|---|---|---|
| 7,126,389 B1 | 10/2006 | McRae et al. | |
| 7,126,427 B2* | 10/2006 | Aoki .............. | 330/311 |
| 2006/0119435 A1* | 6/2006 | Oh et al. ........ | 330/311 |
| 2009/0243665 A1* | 10/2009 | Kumar et al. ... | 327/108 |
| 2011/0095823 A1* | 4/2011 | Gilbert et al. .. | 330/254 |
| 2012/0007680 A1* | 1/2012 | Hijikata et al. .... | 330/278 |
| 2012/0235746 A1* | 9/2012 | Li et al. ........ | 330/261 |
| 2014/0266460 A1* | 9/2014 | Nobbe et al. ... | 330/295 |

FOREIGN PATENT DOCUMENTS

EP    2 251 976 A1    11/2010

OTHER PUBLICATIONS

Extended European Search Report issued in corresponding European application No. 12 30 6692, completion date May 24, 2013.

(Continued)

*Primary Examiner* — Patricia T Nguyen
(74) *Attorney, Agent, or Firm* — Patent Portfolio Builders PLLC

(57) ABSTRACT

There is disclosed a driver circuit for a power amplifier of class D type having a segmented architecture with at least one current branch which can be powered down in a low power mode of operation of the circuit. The branch comprising a switch with a cascode MOS transistor, the circuit further comprises a bias circuitry adapted for dynamically generating a dynamic bias control signal so as to cause the cascode MOS transistor of the switch to be 'Off' in the low power mode.

13 Claims, 5 Drawing Sheets

(56) References Cited

OTHER PUBLICATIONS

Annema, Anne-Johan, et al., "5.5-V I/O in a 2.5-V 0.25 µm CMOS Technology," IEEE Journal of Solid-State Circuits, vol. 36, No. 3, Mar. 2001.

Berkhout, Marco, et al., "Class-D Audio Amplifiers in Mobile Applications," IEEE Transactions on Circuit and Systems—I: Regular Papers, vol. 57, No. 5, DOI: 10.1109/TCSI.2010.2046200, May 2010.

Becker, Rolf, et al., "An Audio Amplifier Providing Up to 1 Watt in Standard Digital 90-nm CMOS," IEEE Journal of Solid-State Circuits, vol. 41, No. 7, DOI:10.1109/JSSC.2006.873674, Jul. 2006.

Samala, Sreekiran, et al., "45 nm CMOS 8Ω Class-D Audio Driver with 79% Efficiency and 100dB SNR," 2010 IEEE International Solid-State Circuits Conference, Feb. 7-11, 2010, ISBN: 978-1-4244-6033-5, pp. 86-87, San Francisco, CA.

Extended European Search Report in corresponding European Application No. 12306692.0-1805 dated May 24, 2013.

* cited by examiner

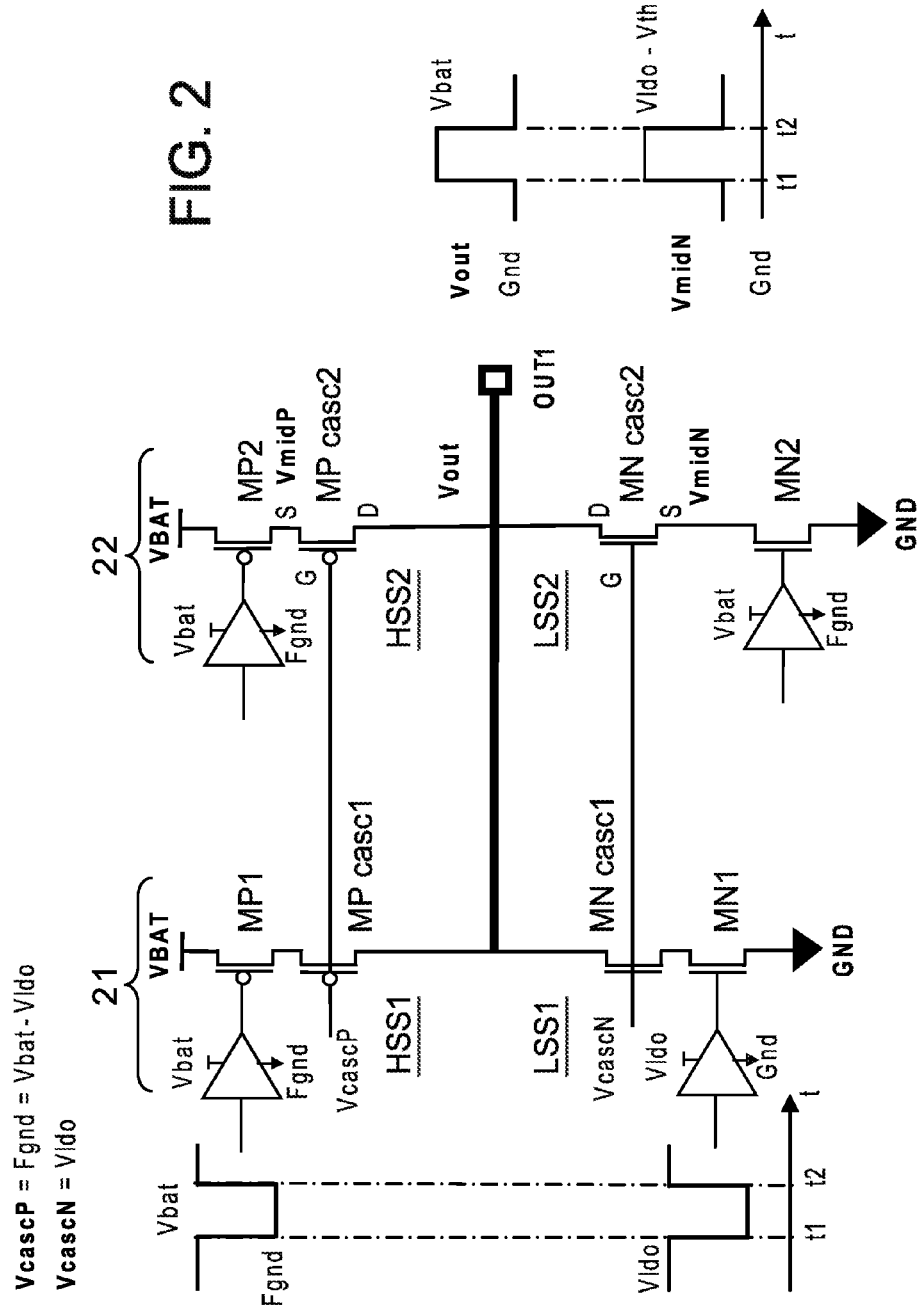

CASCODE BIAS OF POWER MOS TRANSISTORS

RELATED APPLICATIONS

This application claims priority to U.S. Provisional Application No. 61/752,002, filed Jan. 14, 2013, which claims priority and benefit from European Application No. 12306692.0, filed Dec. 27, 2012, the entire teachings of which are incorporated herein by reference.

BACKGROUND

1. Technical Field

The present invention generally relates to the cascode bias of power Metal Oxyde Semiconductor (MOS) transistors used e.g. in a power output stage of audio amplifier circuits.

It finds applications, in particular, in Integrated Circuits (IC) for wireless products such as mobile terminal devices (e.g. cell phones, smart phones, etc.), portable digital media players (e.g. MP3 and MP4 players), portable computers, wireless tablets, portable navigation systems, portable gaming devices, etc.

2. Related Art

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

The need to deliver a wide range of multimedia services to users leads designers of wireless products to provide versatile, high-quality audio functions, including high-output power amplifier for driving e.g. hands-free speakers or earphones. To satisfy high quality user experience in media applications, the complexity of IC has strongly increased, pushing manufacturers to use deep submicron technology in order to integrate more and more complex applications.

Audio amplifiers have followed this trend, thus fulfilling in the same time the demand for high output power and high efficiency amplifiers. However, since the efficiency of the class AB amplifiers traditionally found in audio devices does not exceed 20-25% in most practical situations, a small increase in output power comes at the cost of a large increase in current consumption.

Class D amplifiers offer a potential solution to this challenge, achieving much higher efficiency than class AB amplifiers. In class D amplifiers, the output power may be controlled e.g. by Pulse Width Modulation (PWM). Operating on switching principles, rather than working with output transistors in linear mode, class D amplifiers can reach up to 95% of overall efficiency with a Total Harmonic Distortion (THD) comparable to that obtained with linear amplifiers.

To achieve in the same time high efficiency, high output power and high complexity of Digital Signal Processing (DSP) functions, the partitioning tends to integrate in the same chip some functions of the digital part (like DSP functions) along with circuits of the analog part (like D class audio amplifiers), using a deep submicron technology.

Deep submicron technology is very attractive for the implementation of digital processing units but appears to be very complicated for the design of analog, switched power amplifiers. One of the major difficulties is tied to its poor reliability, due to the thin oxide gate of the submicron technology. This causes also an increase of the consumption in quiescent mode of operation, because the gate capacitance is higher (given that the oxide thickness is much smaller).

In the application to D class amplifiers, power efficiency is however a key parameter for increased lifetime and enhanced user experience. For high output power, the weak point is the MOS resistivity ($Rds_{on}$ parameter) which generates conduction losses, while at low output power or in quiescent mode, the power losses are essentially due to capacitive switching.

To satisfy high output power demand without compromising the reliability of the analog part, designers may consider using extended drain MOS transistors, which can support higher voltage supply. The drawback of this solution is however the extra cost necessary to use special additional masks during the IC manufacturing process. Furthermore, the drain parasitic capacitance of an extended drain MOS transistor is higher than for a conventional MOS transistor, and thus the current consumption is increased.

Designers may also consider using some architectures which include cascoding MOS transistors to support the overall supply voltage. Such solution may be preferred to the extended drain MOS transistors solution, due to its non requirement of additional mask and thus its limited cost. The drawback of this solution, nevertheless, is the extra current consumption necessary to bias the cascode MOS transistors.

One solution for minimizing current consumption in low output power mode may be to segment the power stage into several parallel branches and to power down some branches in the low power mode. The problem is that the cascode MOS transistors must always be biased in order to maintain the reliability during output stage switching. Thus even if some branches are powered down, they consume a lot because of the capacitive switching losses of the cascode MOS transistors within these branches.

Reference [1] entitled "5.5-V I/O in a 2.5-V 0.25-μm CMOS Technology", Anne-Johan Annema, Govert J. G. M. Geelen, and Peter C. de Jong, IEEE JOURNAL OF SOLID-STATE CIRCUITS, Vol. 36, No. 3, March 2001, discloses a high voltage tolerant, open-drain output circuit using thin oxide CMOS technology. It teaches an improvement to the classical single cascode output circuit architecture presented in FIG. 2a. The purpose is to implement an I/O circuit which tolerates supply voltages up to 5.5 V in a 2.5 V tolerant CMOS process using only baseline transistors running at a supply voltage of 2.5 V. This is achieved by using a plurality of stacked cascode transistors, thanks to some design tricks for driving the gate of the upper cascode transistor as shown in FIG. 3a with respect to a double-cascode architecture. Such design tricks include using a non-stationary gate voltage for one of the cascode transistors. However, the issue current consumption is not addressed by the teachings in this reference.

SUMMARY

The concept of the invention is to decrease the power stage consumption of a driver circuit having a power output stage with a segmented architecture, by adapting the bias of cascode MOS transistors of powered down branches during output stage switching without impacting the reliability. Indeed, even in low power mode the cascode MOS of the down-powered branches of a classical segmented power output stage still consumes a lot, because the cascode MOS channel is always present. Thus, the gate capacitor Cgs of the cascode transistor to be charged and discharged during output switching has a high value. Proposed embodiments rely on the idea of forcing the non-creation of MOS channel of the cascode of down-powered branches of the power output stage, thus limiting the value of the gate capacitors, namely the gate-to-source capacitor Cgs and the gate-to-drain capacitor Cgd.

Indeed, when the MOS channel is created (i.e., when the MOS transistor is in saturation), the Cgs capacitor is equal to $\frac{2}{3} \cdot C_{ox} \times W \times L$, where W and L are the width and the length of the MOS gate, respectively, whereas it is only equal to the non overlap capacitor (which is relatively low for a standard, namely non extended MOS transistor) when the MOS transistor is blocked.

A first aspect of the proposed solution relates to a driver circuit for a power amplifier of class D type comprising:
 at least a first output terminal;
 a high power supply rail receiving a high power supply voltage and a low power supply rail receiving a low supply voltage;
 at least first and second current branches arranged in parallel between the high power supply rail and the low power supply rail, each comprising at least a first switch and being adapted for driving power to the output terminal, and said second current branch being powered in a first configuration of the driver circuit and being powered down in a second configuration of the driver circuit;
 wherein:
 the first switch of the first branch comprises a switching Metal Oxyde Semiconductor, MOS, transistor of a first conduction type, N or P, controlled by a first switching signal, in series with a cascode MOS transistor (MNcasc1) of said first conduction type, controlled by first static bias control signal;
 the first switch of the second branch comprises a switching MOS transistor of the first conduction type, controlled by a second switching signal, in series with a cascode MOS transistor of said first conduction type, controlled by a first dynamic bias control signal; and,
 the driver circuit further comprising a first bias circuitry adapted for dynamically generating the first dynamic bias control signal from the first static bias control signal and from at least one additional control signal enabling operation of the driver circuit in the second configuration, said first bias circuitry being further adapted to cause the cascode MOS transistor of the first switch of the second branch to be 'Off' in said second configuration of the driver circuit.

The advantage of the proposed embodiments is the decrease in the current consumption when the D class amplifier delivers low output power. Furthermore, the efficiency is not impacted in high power mode. Finally, the reliability is not affected at all. In terms of performance, implementation of the proposed solution allows decreasing by 50% the current losses in the down-powered branches.

In one embodiment, the first bias circuitry is adapted for causing a gate terminal of the cascode MOS transistor of the first switch of the second branch to be connected to the lower voltage between a voltage at the output terminal and a voltage of the first static bias control signal.

Assuming that the first conduction type is the N conduction type, the switching MOS transistor of the first switch of the second branch may be a NMOS transistor of a given deep submicron CMOS technology, and the cascode MOS transistor of the first switch of the second branch is then a also NMOS transistor.

In this case, the first bias circuitry may be adapted for causing the gate terminal of the cascode MOS transistor of the first switch of the second branch to receive the first static bias control signal if the voltage at the output node goes above the voltage of said first static bias control signal plus a threshold voltage of NMOS transistors in the CMOS technology, or to be connected to the output terminal if the voltage at the output node goes below the first static bias control signal minus said threshold voltage.

In some embodiments the driver circuit may further comprise a first additional circuitry adapted for controlling a voltage at a common source node of the switching MOS transistor and the cascode MOS transistor of the first switch of the second branch, so that said voltage is kept at the voltage of the first static bias control signal.

In other embodiments:
 the first current branch may further comprise a second switch having a switching MOS transistor of a second conduction type, opposite to the first conduction type, controlled by a second switching signal, in series with a cascode MOS transistor of a second conduction type, opposite to the first conduction type, controlled by a second static bias control signal,
 the second current branch further comprises a second switch having a switching MOS transistor of a the conduction type, controlled by the second switching signal, in series with a cascode MOS transistor of said second conduction type, controlled by a second dynamic bias control signal,
 the driver circuit further comprising a second bias circuitry adapted for dynamically generating the second dynamic bias control signal from the second static bias control signal and from the at least one additional control signal enabling operation of the driver circuit in the second configuration, said second bias circuitry being further adapted to cause the cascode MOS transistor of the second switch of the second branch to be 'Off' in said second configuration of the driver circuit.

The second bias circuitry may be adapted for causing a gate terminal of the cascode MOS transistor of the second switch of the second branch to be connected to the upper voltage between a voltage at the output terminal and a voltage of the second static bias control signal.

Assuming that the first conduction type is the N conduction type and the second conduction type is the P conduction type, the switching MOS transistor of the second switch of the second branch may be a PMOS transistor of a given deep submicron CMOS technology, and the cascode MOS transistor of the second switch of the second branch is then a also PMOS transistor.

In some embodiments, the second bias circuitry may be adapted for causing the gate terminal of the cascode MOS transistor of the second switch of the second branch to receive the second static bias control signal if the voltage at the output node goes below the voltage of said second static bias control signal minus a threshold voltage of PMOS transistors in the CMOS technology, or to be connected to the output terminal if the voltage at the output node goes above the first static bias control signal plus said threshold voltage.

The driver circuit may further comprise a second additional circuitry adapted for controlling a voltage at a common source node of the switching MOS transistor and the cascode MOS transistor of the second switch of the second branch, so that said voltage is kept at the voltage of the second static bias control signal.

A second aspect relates to a power amplifier of class D type comprising a driver circuit according to the first aspect as presented above.

A third aspect relates to an Integrated Circuit realized in a deep submicron CMOS technology comprising a digital part and an analog part, wherein the analog part comprises the power amplifier of the second aspect.

Finally, a fourth aspect relates to a wireless product, comprising the Integrated Circuit according to the third aspect.

BRIEF DESCRIPTION OF THE DRAWINGS

The present invention is illustrated by way of example, and not by way of limitation, in the figures of the accompanying drawings, in which like reference numerals refer to similar elements and in which:

FIG. 2 is a schematic circuit diagram of a driver circuit implementing the principle of power stage segmentation on which the proposed solution relies.

DESCRIPTION OF PREFERRED EMBODIMENTS

Figure 1:
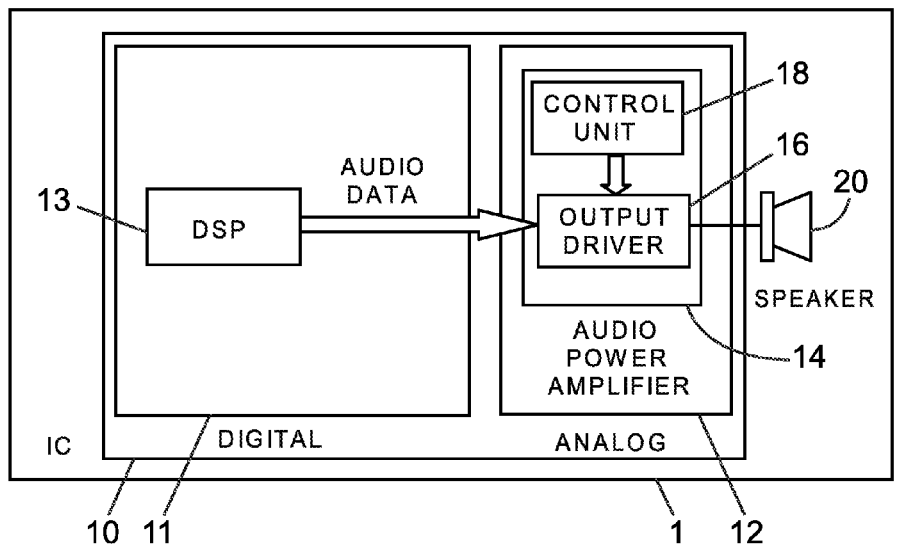
FIG. 1 is a simplified block diagram of an example of wireless product which may incorporate an IC embodying an audio amplifier which implements the proposed solution.

With reference to the simplified block diagram of FIG. 1, there will first be described an example of wireless product 1 which may incorporate an IC embodying an audio amplifier which implements the proposed solution.

The wireless product 1 may be, for instance, a mobile terminal device such as a cell phone or a smart phone, a portable digital media players such as a MP3 or MP4 player, a portable computer, a wireless tablet, a portable navigation terminal, a portable gaming device, etc.

In the shown example, the wireless product 1 comprises an Integrated Circuit 10, such as a System-on-Chip (SoC), which may be manufactured using a deep submicron CMOS process. For example, the IC 10 may be based on a standard 2.5 V—40 nm CMOS technology. It will be appreciated, however, that the present description is not intended to be limited to this example.

The IC 10 may exhibit a partitioning between a digital part 11 and an analog part 12. The digital part 11 may comprise a Digital Signal Processor 13 which is adapted to implement DSP functions, such as audio decoding, for instance. The analog part 12 may comprise analog circuits, like at least one D class audio power amplifier 14. Both the digital part 11 and the analog part 12 are obtained using the same deep submicron technology. It results there from that, in particular, the MOS transistors comprised in the audio power amplifier(s) 14 have a thin gate oxide layer. Thus, a nominal voltage tied to the technology can, at maximum, be applied on the gate of the MOS transistors without damage to the oxide layer, be they of the N-type conductivity or of the P-type conductivity. This nominal voltage is equal to 2.5 V in the example considered here of a 2.5 V—40 nm CMOS technology.

The power amplifier(s) 14 may comprise an output driver 16, which may have a class D output driver architecture. Class-D output drivers offer better efficiency than class-AB output drivers, thereby reducing the overall power consumption of the audio amplifier, especially at high output levels. As they are switched mode amplifiers, the audio power amplifier 14 additionally comprise a control unit 18, adapted to generate control signals for controlling the output driver 16.

To summarize, audio data generated by the processor 13 of the digital part 11 are passed to the analog part 12 in order to be played on e.g. a speaker 20 of the wireless product 1, through the output driver 16 of the audio power amplifier 14. Output power for loudspeaker or earphone drivers in mobile applications typically ranges from 500 mW to 1 W, with a trend toward higher power.

The principle of power stage segmentation applied to an output driver of a class D amplifier is shown in FIG. 2.

As it implements the principle of power stage segmentation, the class-D amplifier of FIG. 1 comprises at least two current branches 21 and 22, arranged in parallel between a high supply rail or low supply rail. More branches may be considered, depending on the output power level to be attained. The higher the power level, the higher the number of current branches.

In the shown example, the high supply rail receives a positive power supply Vbat, which may be provided directly from the product battery. The low supply rail is, e.g. at the potential Gnd of the ground. The battery voltage Vbat typically ranges between 2.5 and 4.5 V, and can be as high as 5.5 V during charging. In some applications, Vbat can be boosted to reach even higher output voltages/

Each of the branches 21 and 22 has two low-ohmic switches, namely a high-side switch HSS1 and a low-side switch LSS1 for branch 21, and a high-side switch HSS2 and a low-side switch LSS2 for branch 22. In each branch, the high-side switch and a low-side switch alternately connect the output terminal OUT1 of the power stage to the high supply rail or low supply rail, respectively. Each of the switches HSS1, LSS1, HSS2 and LSS2 comprises a switching MOS transistor MP1, MN1, MP2 and MN2, respectively, in series with a cascode transistor MPcasc1, MNcasc1, MPcasc2 and MNcasc2, respectively. The MOS transistors, namely both the switching and cascode transistors, of each of the low-side switches LSS1 and LSS2 are MOS transistors of the N-type conductivity (NMOS). The MOS transistors, namely both the switching and cascode transistors, of each of the high-side switches HSS1 and HSS2 are MOS transistors of the P-type conductivity (PMOS). The switching transistors are connected by their source to the corresponding supply rail, and the cascode transistors are connected by their drain to the output terminal OUT1.

The function of the cascode transistors is to limit the maximum voltage between the drain and source terminals of their associated switching transistors to the highest tolerated voltage allowed by the technology and, thus, to limit oxide stress to the maximum acceptable level of 2.5 V. This way, overall voltage tolerance can be achieved to reliably handle a maximum output swing of 2.5 V across the drain-source path of the switching transistors, which corresponds to the nominal voltage of the baseline submicron CMOS process for standard transistors.

The PMOS switching transistors MP1 and MP2 are controlled by one and the same control voltage through a dedicated driver unit supplied between Vbat and Fgnd, which is represented at the top left of FIG. 2. Similarly, the NMOS switching transistors MN1 and MN2 are controlled by one and the same control voltage through a dedicated driver unit supplied between Vldo and Gnd, which is represented at the bottom left of FIG. 2. These control voltages may be generated by the control unit 18 of the audio power amplifier as shown in FIG. 1. In one embodiment, they are pulse-width modulated, as a function of the audio data received from the digital part 11 of the IC as shown in FIG. 1.

The PMOS cascode transistors MPcasc1 and MPcasc2 are controlled by one and the same control voltage VcascP. Similarly, the NMOS cascode transistors MNcasc1 and MNcasc2 are controlled by one and the same control voltage VcascN. In a standard power stage with switches having cascaded switching and cascode transistors as shown in FIG. 2, the cascode transistors have a bias which is constant over the time. Stated otherwise, the control signals VcascN and VcascP are constant voltages. In the shown example, we have:

$$VcascN = Vldo \quad (1)$$

$$VcasP = Vbat - Vldo \quad (2)$$

where Vldo is the nominal voltage tied to the relevant CMOS technology, namely 2.5 V in the example of the 2.5 V–40 nm CMOS technology considered here.

In the remaining of this description and in the drawings, we will name Fgnd the voltage corresponding to Vbat−Vldo; namely we have:

$$Fgnd = Vbat - Vldo \quad (3)$$

Finally, It us name VmidN the voltage at the common node between the two NMOS transistors of switch LSS2 of the second branch 22, and VmidP the voltage at the common node between the two PMOS transistors of switch LSS2 of the second branch 22.

The efficiency of a power stage as shown in FIG. 2 is determined by essentially two factors, namely the switch impedance and the switching frequency. Finite switch impedance causes conductive losses which are proportional to the square of the output current and is usually the limiting factor for efficiency at full power. At low output power, switching losses are the dominant factor. For each output transition, the input capacitance of the switch devices needs to be charged (or discharged), causing charging losses which are proportional to input capacitance and switching frequency. In addition, finite switching speeds cause energy loss during each output transition. Switch impedance is inversely proportional to the size of the switch device, whereas input capacitance linearly scales with size. For high efficiency, the switching frequency must be as low as possible, whereas the switch device size should be optimized to trade off conductive and charging losses.

Figure 3:
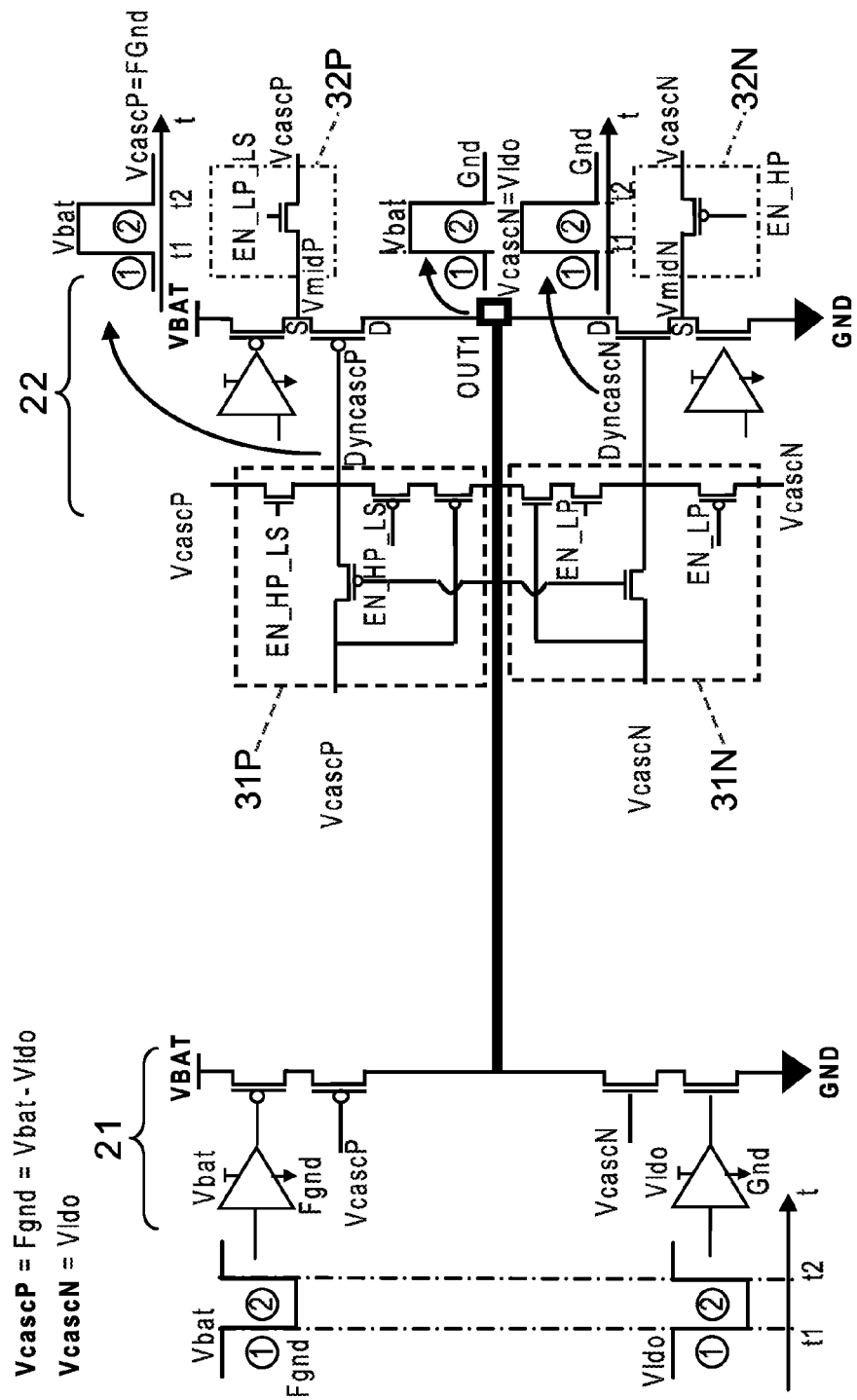
FIG. 3 is a schematic circuit diagram illustrating embodiments of the proposed solution applied to the driver circuit of FIG. 2.

Embodiments of the proposed solution are shown in the schematic circuit diagram of FIG. 3, in which the same power stage as in FIG. 2 is represented, along with additional control circuitry. However, in an attempt not to overcharge the drawings and keep their maximum intelligibility, some reference signs which label the switches and their transistors in FIG. 2 are not represented in FIG. 3.

As previously described with reference to FIG. 2, the power stage is segmented in two branches 21 and 22. It will be appreciated, however, that the invention is not intended to be limited to this example, and that the power stage may be segmented in more than two branches. Also, all switching transistors are protected by an associated cascode transistor of the same type of conductivity, namely N or P.

The main difference with the power stage as previously described with reference to FIG. 2 is that the cascode transistors MNcasc2 and MPcasc2 of the low-side switch LSS2 and of the high side switch HSS2 of the second branch 22, respectively, is controlled by a control signal DyncascN and by a control signal DyncascP respectively. These latter signals are derived from the control signal VcascN and from the control signal VcascP, respectively, which control the low-side switch LSS1 and of the high side switch HSS1 of the first branch 21, respectively. More precisely, signal control signal DyncascN is derived from control signal VcascN, thanks to a first cascode driving circuitry 31N, and the signal control signal DyncascP is derived from control signal VcascP thanks to a second cascode driving circuitry 31P.

The first cascode driving circuitry 31N, which is adapted for driving the NMOS cascode transistor MNcasc2 of the low-side switch LSS2 of branch 22, mainly comprises transistors of the same conduction type as said cascode transistor. In one example, it comprises three NMOS transistors and one PMOS transistor arranged as shown in FIG. 3. One of these NMOS transistors and the PMOS transistor of the circuitry 31N are both controlled by a control signal EN_LP.

More precisely, the voltage at the gate of MNcasc2 is defined by the three following means:
  a first NMOS transistor which is arranged as a first controlled switch to dynamically connect the control voltage VcascN to the gate of the cascode transistor MNCasc2, and is controlled to that end by the voltage at the output node OUT1;
  a second NMOS transistor which is arranged as a second controlled switch to dynamically connect the voltage at the output node OUT1 to the gate of the cascode transistor MNCasc2, and is controlled to that end by the control voltage VcascN. Also, this second NMOS transistor is cascoded with a third NMOS transistor, whose gate is controlled by control signal EN_LP; and,
  the aforementioned PMOS transistor which is arranged as a third controlled switch to dynamically connect the control voltage VcascN to the gate of the cascode transistor MNCasc2, and is controlled to that end by the control signal EN_LP.

As shown by the chronogram at bottom right of FIG. 3, the control signal DyncascN is connected to VcascN=Vldo (by the above first NMOS transistor of the first means) if the voltage at the output node OUT1 goes above VcascN plus VthN (where VthN is the threshold voltage of said first NMOS transistor of said first means), or is connected to the output voltage at the output node OUT1, namely Gnd, if this voltage goes below VcascN minus VthN. Stated otherwise, the gate of the cascode NMOS transistor is connected to the lower voltage between the output voltage at node OUT1 and the control voltage VcascN. In both switching phases 1 and 2 of the switching cycle (represented by FIGS. 1 and 2 in small circles in the chronograms showing voltages as a function of time at the right of FIG. 3), the cascode NMOS transistor MNcasc2 is 'Off'. Thus, the switching losses in the down-powered branch 22 are minimized.

Similarly, the second cascode driving circuitry 31P, which is adapted for driving the PMOS cascode transistor MPcasc2 of the high-side switch HSS2 of branch 22, comprises three PMOS transistors and one NMOS transistor arranged as shown in FIG. 3 in a complementary manner compared to the MOS transistors of circuitry 31N as described above. The third of these PMOS transistors and the NMOS transistor of circuitry 31P are controlled by a control signal EN_HP and by a control signal EN_HP_LS, respectively.

As shown by the chronogram at top right of FIG. 3, the control signal DyncascP is connected to VcascP if the voltage at the output node OUT1 goes below VcascP minus VthP, or is connected to the output OUT1 and thus to the battery voltage Vbat, if the output node OUT1 goes above VcascP plus VthP. In both phases 1 and 2 of the switching cycle, the cascode PMOS transistor MPcasc2 is 'Off'. Thus, the switching losses in the down-powered branch 22 are minimized.

Control signals EN_LP, EN_HP, EN_LP_LS and EN_HP_LS may be generated by the control unit 18 of the audio power amplifier as shown in FIG. 1. As they are binary signals, they will also be called control bits in what follows.

Control bit EN HP LS carries the same information as EN_HP, but is level shifted to Fgnd–Vbat levels for reliability purpose. Indeed in deep submicron technology, the MOS transistor cannot directly support the Vbat voltage. Voltage Vldo represents the maximum voltage that can be applied on the gate of the MOS transistor without damage. For a MOS transistor of the P-conduction type (known as a PMOS), voltage Fgnd is then dimensioned so as to avoid gate breakdown: Fgnd=Vbat–Vldo, as defined by relation (3) above.

The control bit EN_HP and the control bit EN_LP enable the high power mode and the low power mode, respectively. In the high power mode of operation of the audio power amplifier, all of the branches 21 and 22 are 'on' and deliver current to the output terminal OUT1. Control bit EN_HP is the binary inverse, i.e. the complementary of the control bit EN_LP.

In some embodiments, reduction of the switching losses in the down-powered branch 22 may be achieved in the low power mode not only through the dynamic cascode bias control voltages DyncascN and DyncascP of the cascode transistors NMcascN and MPcascP as described above, but also through still another additional circuitry 32N and another additional circuitry 32P controlling the node voltages VmidN and VmidP, respectively.

Thanks to these circuitries 32N and 32P, voltage VmidN at common node between transistors MN2 and MNcasc2, and voltage VmidP at the common node between transistors MP2 and MPcasc2, respectively, are kept stuck to VcascN and to VcascP, respectively. Thus, capacitive losses due to the switching NMOS transistor MN2 and to the switching PMOS transistor MP2, respectively, is null. For these switching MOS transistors, indeed, the channel is not created. In such embodiments, control signal DyncascN is still connected to the output node OUT1 if the voltage at said output node OUT1 goes below VcascN minus VthN, or is connected to VcascN if the voltage at the output node OUT1 goes above VcascN plus VthN, where VthN is the voltage threshold of a NMOS. Corresponding configuration is also maintained for control signal DyncascP.

The operation of second branch 22 of the audio power amplifier which can be powered down according to the power stage segmentation principle, is as follows.

Figure 4A:
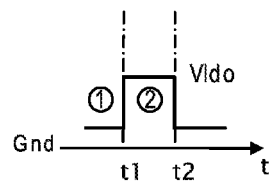
FIG. 4A, 4B and 4C show, as a function of time, the gate, drain and source voltages, respectively, of a low-side cascode transistor of a down-powered branch of the driver circuit of FIG. 3 which is biased in accordance with the proposed solution.

Let us first consider the operation of the low-side switch LSS2 of branch 22. In both phases 1 and 2 of the switching cycle (which are identified, in the drawings of FIGS. 4A-4C and 5A-5C, by FIGS. 1 and 2 in small circles), the Cascode MOS transistor MNcasc2 is 'Off'. Indeed its gate voltage Vg(MNcasc2) is always the most possible negative voltage, in both phases: namely, it is equal to the voltage output at the output node OUT1, namely Gnd, in phase 1 and to VcascN=Vldo in phase 2, as shown in FIG. 4A.

Figure 4B:
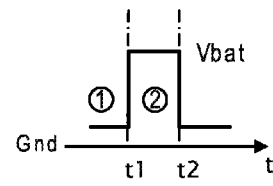
Figure 4C:
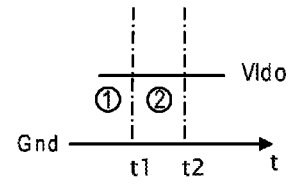

FIG. 4B and FIG. 4C show the drain voltage Vd(MNcasc2) and the source voltage Vs(MNcasc2), respectively, of the Cascode MOS transistor MNcasc2 in both phases 1 and 2 of the switching cycle. During transition of the voltage at the output node OUT1, the gate-source voltage Vgs or the gate-drain voltage Vgd of MNcasc2 is never above the threshold voltage of this MOS transistor. Thus the channel of the cascode MOS transistor MNcasc2 is never created. Consequently, the Cgs and Cgd capacitors of the cascode MOS transistor MNcasc2 are only equal to the its overlap capacitor, which is very low compared to the value $\frac{2}{3} \times C_{ox} \times W \times L$ which it has when the channel is created.

As far as the part of the high-side switch HSS2 is concerned, the reasoning is the same. DyncascP is connected to VcascP if the voltage at the output node OUT1 goes below VcascP minus VthP, or is connected to the output if the output node OUT1 goes above VcascP plus VthP. In both phases, the cascode PMOS transistor MPcasc2 is 'Off'. Thus, the switching losses in the down-powered branch 22 are minimized.

Figure 5A:
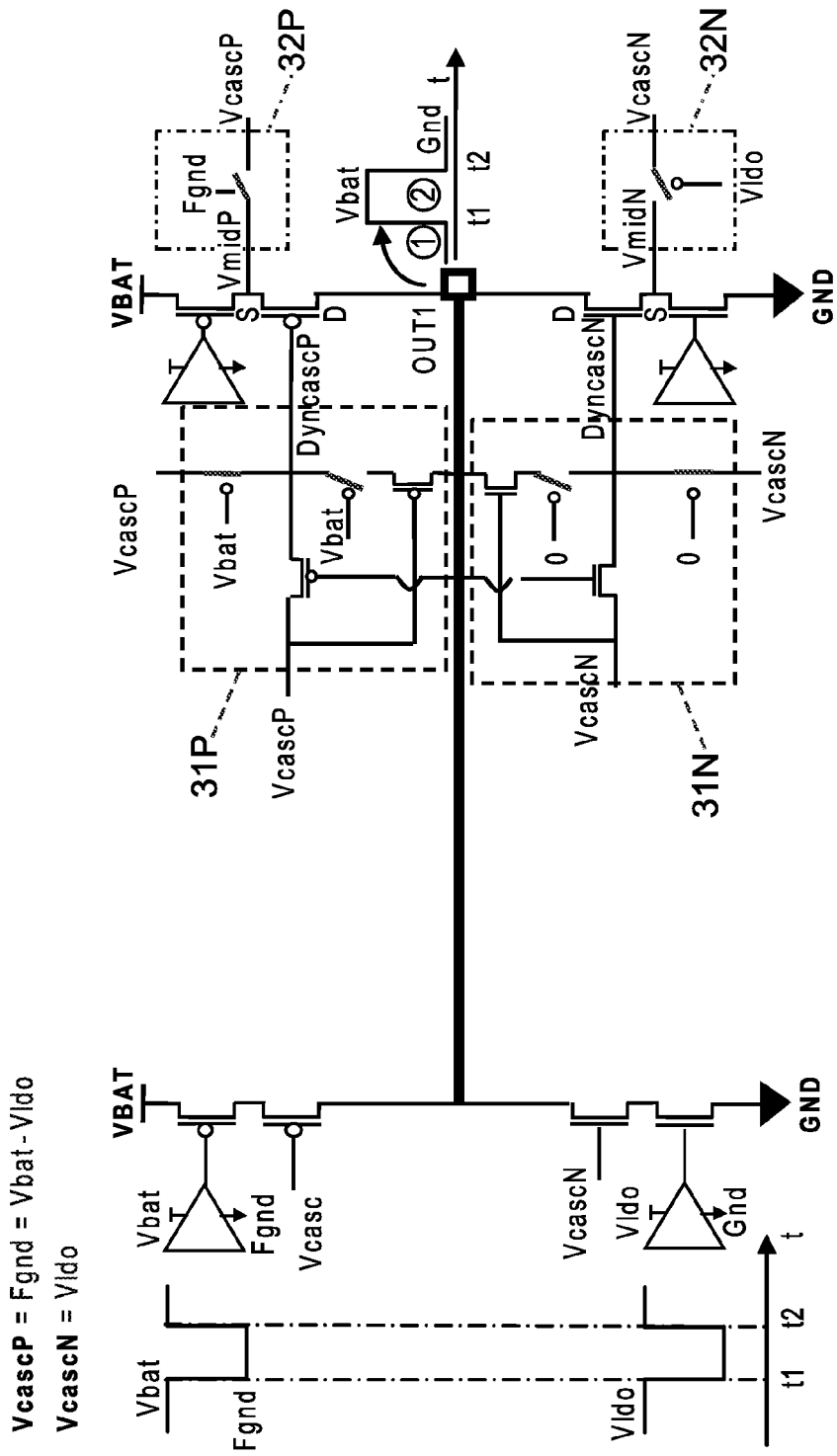
FIG. 5A and 5B illustrate the driver circuit of FIG. 3, in a low power mode and in a high power mode, respectively.
Figure 5B:
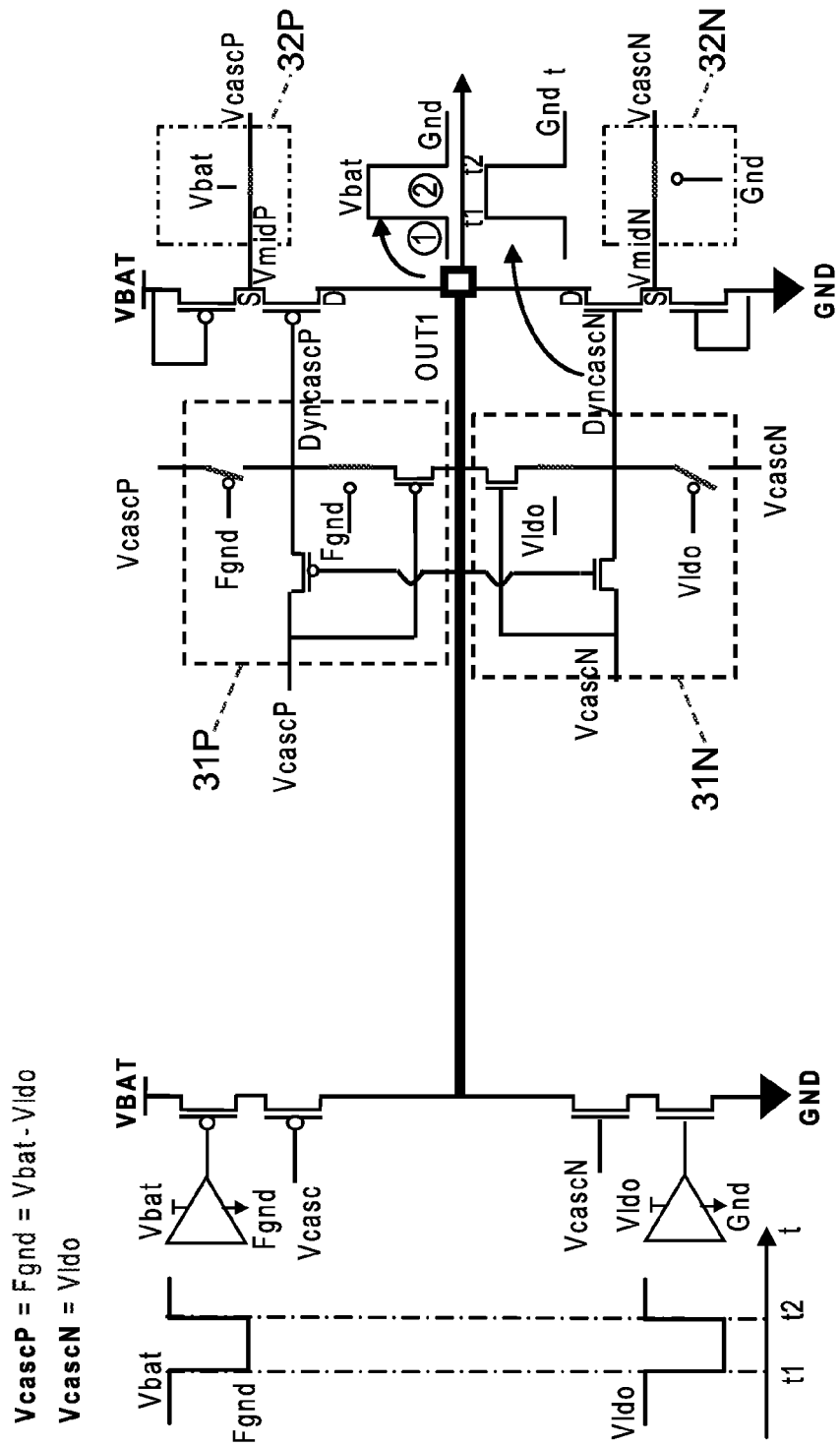

The circuit of FIG. 3 is represented in FIG. 5A in a first configuration, which corresponds to the high power mode, and is represented in FIG. 5B in a second configuration which corresponds to the low power mode.

In high power mode as shown in FIG. 5A, all the branches are used. To this end, the set of control signals is generated by the control unit 18 of FIG. 1 so as to exhibits the following configuration:

EN_LP=GND,

EN_HP=Vldo,

EN_LP_LS=Fgnd, and,

EN_HP_LS=Vbat,

Thus, it comes that DyncascN and DyncascP signals are set to the VcascN and VcascP control voltages, respectively. It will be noted that the configuration of FIG. 5A corresponds to the "standard" implementation of a power amplifier relying on power stage segmentation as shown in FIG. 2.

In low power mode, however, the second branch is powered down, by causing the control unit 18 to provide the following configuration:

En_LP=Vldo

EN_HP=Gnd,

En_LP_LS=Vbat, and

EN_HP_LS=Fgnd.

In this configuration, which is illustrated by the schematic circuit diagram of FIG. 5B, the gate of the NMOS switch of the second branch and the gate of PMOS switch are connected to GND and to Vbat, respectively. In both phases 1 and 2 of the switching cycle, the cascode NMOS transistor MNcasc2 and the cascode PMOS transistor MPcasc2 are 'Off'. Thus, the switching losses in the down-powered branch 22 are minimized.

It will be appreciated that the additional circuitry 31N and 31P added to control the gate of the cascode transistors of the dynamic branch 22 does not consume a lot of current due to its small gate area. Because the cascode MOS transistors are 'Off', their gates are not highly capacitive, and therefore the amount of current necessary to drive the gate of cascode transistors MNcasc2 and MPcasc2 by control signals DyncascN and DyncascP is low.

To summarize, the extra circuitry does not need to be big to drive the different nodes.

Analyzing the architecture in terms of reliability against voltage swings, it can be appreciated that the additional circuitry does not affect the maximum voltage seen by the MOS transistors. Thanks to the extra circuitry, the cascode gate voltage is always set to the minimum voltage to guarantee the reliability. Indeed, in high power mode, the circuit comes to the normal configuration as shown in FIG. 1. Therefore, if Vldo and Fgnd are correctly tuned, no issue occurs. In low power mode, the cascode MOS transistors do not see voltage higher than the Vldo voltage. Indeed, in phase 1, the cascode NMOS has its gate at GND level and its drain at GND level too. In phase 2, its gate is at Vldo and its drain is at Vbat. Thus, it is the same configuration as the one in high power mode, without stress on the MOS transistors too. The reasoning is the same for the PMOS, namely the high side part of the branch 22.

It will be further appreciated that the power stage shown in FIG. 2 may be implemented as the half bridge of a full H-bridge audio amplifier. In such a case, the audio amplifier would comprise another, similar half bridge structure, for driving a second output terminal. The load, namely the speaker, would be connected between the first output terminal OUT1 and this second output terminal, and the two half-bridge structure would be controlled in opposite phases so that.

Indeed, a class-D output stage can be either single-ended, as it has been described so far in the foregoing, or differential. A differential class-D output stage comprises two single ended class-D output stage as described above, namely each one for driving one of the two sides of the loudspeaker load, respectively. More precisely, the two single-ended class-D output stages are driven in opposite phase. This enables operation doubling the voltage swing across the load while still using the same power supply, and thus allows providing four times more power to the load.

In some embodiments, further, the high side switches may be replaced by a pull-up structure, for instance a RC cell. In a variant, the low side switches may be replaced by a pull-down structure, again a RC cell in one example.

In some embodiments, the high side transistors HSS2 and HSS1 can be also NMOS transistors, meaning that the driver can have so-called "dual N" architecture. The proposed solution can indeed also be applied to a dual N architecture.

For embodiments using some technology process which can tolerate Vbat, Vldo can be equal to Vbat and Fgnd can be equal to GND.

Referring back to the prior art disclosed in Reference [1] identified in the above "background section", the following differences with the proposed solution as described above will be noted by the one with ordinary skills in the art.

Firstly, the purpose of this article is to describe a high voltage tolerant I/O using thin oxide, and therefore it discloses an improvement to the "classical" cascode I/O. The presented circuit, thanks to design tricks, is able to support up to 2.5×Vdd (where Vdd=2.5V) for supply. Classical cascode I/O are presented in FIG. 2a. This architecture according to the authors is limited to 1.8×Vdd. In the proposed solution, this classical topology is used but with no specific intention to increase the supporting supply up to 5.5V. The goal is totally different, the architecture is limited to a 1.8×Vdd architecture, and what is proposed is a way to decrease the consumption of the power stage or I/O.

Secondly, the switching logic disclosed in Reference [1] for controlling the gate of the NMOS cascode transistor is totally different from the proposed bias circuitry. In FIG. 3b, one can see that the switch is done with PMOS transistors, instead of NMOS transistors in the proposed solution. The use of PMOS transistors has a clear reason. The switching logic has indeed a different purpose: it connects the gate of the cascode transistor to the output I/O when the I/O is "high", and connects to Vdd=2.5 V when the output I/O is "low". This is why PMOS transistors are required. In the proposed solution, it is the opposite way. The goal is to connect the gate of the cascode transistors always to the lowest voltage between the voltage at the output terminal and voltage of the VcascN control voltage (which is similar to Vdd=2.5 in the article). In contrast, in the article, it is sought to connect the gate of the cascode NMOS transistor to the upper voltage between the I/O output voltage and Vdd=2.5 V.

To conclude, the teaching in this article has a purpose and implementation totally different from the proposed solution.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the invention as broadly defined above.

A person skilled in the art will readily appreciate that various parameters disclosed in the description may be modified and that various embodiments disclosed and/or claimed may be combined without departing from the scope of the invention.

The invention claimed is:

1. Driver circuit for a power amplifier of class D type comprising:
   at least a first output terminal;
   a high power supply rail receiving a high power supply voltage and a low power supply rail receiving a low supply voltage;
   at least first and second current branches arranged in parallel between the high power supply rail and the low power supply rail, each comprising at least a first switch and being adapted for driving power to the output terminal, and said second current branch being powered in a first configuration of the driver circuit and being powered down in a second configuration of the driver circuit;
   wherein:
   the first switch of the first branch comprises a switching Metal Oxyde Semiconductor, MOS, transistor of a first conduction type, N or P, controlled by a first switching signal, in series with a cascode MOS transistor of said first conduction type, controlled by first static bias control signal;
   the first switch of the second branch comprises a switching MOS transistor of the first conduction type, controlled by a second switching signal, in series with a cascode MOS transistor of said first conduction type, controlled by a first dynamic bias control signal; and,
   the driver circuit further comprising a first bias circuitry adapted for dynamically generating the first dynamic bias control signal from the first static bias control signal and from at least one additional control signal enabling operation of the driver circuit in the second configuration, said first bias circuitry being further adapted to cause the cascode MOS transistor of the first switch of the second branch to be 'Off' in said second configuration of the driver circuit.

2. The driver circuit of claim 1, wherein the first bias circuitry is adapted for causing a gate terminal of the cascode MOS transistor of the first switch of the second branch to be connected to the lower voltage between a voltage at the output terminal and a voltage of the first static bias control signal.

3. The driver circuit of claim 1, wherein the first conduction type is the N conduction type, whereby the switching MOS transistor of the first switch of the second branch is a NMOS transistor of a given deep submicron CMOS technology, and the cascode MOS transistor of said first switch of the second branch is a also NMOS transistor.

4. The driver circuit of claim 3, wherein the first bias circuitry is adapted for causing the gate terminal of the cascode MOS transistor of the first switch of the second branch to receive the first static bias control signal if the voltage at the output node goes above the voltage of said first static bias control signal plus a threshold voltage of NMOS transistors in the CMOS technology, or to be connected to the output terminal if the voltage at the output node goes below the first static bias control signal minus said threshold voltage.

5. The driver circuit of claim 1, further comprising a first additional circuitry adapted for controlling a voltage at a common source node of the switching MOS transistor and the cascode MOS transistor of the first switch of the second branch, so that said voltage is kept at the voltage of the first static bias control signal.

6. The driver circuit of claim 1, wherein:
the first current branch further comprises a second switch having a switching MOS transistor of a second conduction type, opposite to the first conduction type, controlled by a second switching signal, in series with a cascode MOS transistor of a second conduction type, opposite to the first conduction type, controlled by a second static bias control signal,
the second current branch further comprises a second switch having a switching MOS transistor of a the conduction type, controlled by the second switching signal, in series with a cascode MOS transistor of said second conduction type, controlled by a second dynamic bias control signal,
the driver circuit further comprising a second bias circuitry adapted for dynamically generating the second dynamic bias control signal from the second static bias control signal and from the at least one additional control signal enabling operation of the driver circuit in the second configuration, said second bias circuitry being further adapted to cause the cascode MOS transistor of the second switch of the second branch to be 'Off' in said second configuration of the driver circuit.

7. The driver circuit of claim 6, wherein the second bias circuitry is adapted for causing a gate terminal of the cascode MOS transistor of the second switch of the second branch to be connected to the upper voltage between a voltage at the output terminal and a voltage of the second static bias control signal.

8. The driver circuit of claim 6, wherein the first conduction type is the N conduction type and the second conduction type is the P conduction type, whereby the switching MOS transistor of the second switch of the second branch is a PMOS transistor of a given deep submicron CMOS technology, and the cascode MOS transistor of said second switch of the second branch is a also PMOS transistor.

9. The driver circuit of claim 8, wherein the second bias circuitry is adapted for causing the gate terminal of the cascode MOS transistor of the second switch of the second branch to receive the second static bias control signal if the voltage at the output node goes below the voltage of said second static bias control signal minus a threshold voltage of PMOS transistors in the CMOS technology, or to be connected to the output terminal if the voltage at the output node goes above the first static bias control signal plus said threshold voltage.

10. The driver circuit of claim 6, further comprising a second additional circuitry adapted for controlling a voltage at a common source node of the switching MOS transistor and the cascode MOS transistor of the second switch of the second branch, so that said voltage is kept at the voltage of the second static bias control signal.

11. Power amplifier of class D type comprising a driver circuit according to claim 1.

12. Integrated Circuit realized in a deep submicron CMOS technology comprising a digital part and an analog part, wherein the analog part comprises the power amplifier of claim 11.

13. Wireless product, comprising the Integrated Circuit of claim 12.

\* \* \* \* \*